(12) United States Patent
Nomachi

(10) Patent No.: US 9,520,339 B2
(45) Date of Patent: Dec. 13, 2016

(54) SEMICONDUCTOR DEVICE AND METHOD OF MANUFACTURING THE SAME

(71) Applicant: Kabushiki Kaisha Toshiba, Tokyo (JP)

(72) Inventor: Akiko Nomachi, Yokohama (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 0 days.

(21) Appl. No.: 14/615,400

(22) Filed: Feb. 5, 2015

(65) Prior Publication Data
US 2015/0155223 A1    Jun. 4, 2015

Related U.S. Application Data

(62) Division of application No. 13/593,980, filed on Aug. 24, 2012, now abandoned.

(30) Foreign Application Priority Data

Oct. 19, 2011 (JP) .................................. 2011-230008

(51) Int. Cl.
H01L 21/76 (2006.01)
H01L 23/48 (2006.01)
(Continued)

(52) U.S. Cl.
CPC ......... *H01L 23/481* (2013.01); *H01L 21/3065* (2013.01); *H01L 21/3213* (2013.01);
(Continued)

(58) Field of Classification Search
CPC .................... H01L 21/76831; H01L 21/76898; H01L 21/02063; H01L 21/486; H01L 23/481; H01L 23/49827; H01L 23/5384
(Continued)

(56) References Cited

U.S. PATENT DOCUMENTS

2010/0102454 A1* 4/2010 Akiyama .......... H01L 21/76898
257/774
2011/0024849 A1 2/2011 Akiyama

FOREIGN PATENT DOCUMENTS

JP 2003-154304 5/2003
JP 2011-009645 1/2011
(Continued)

OTHER PUBLICATIONS

Office Action mailed by the Japanese Patent Office on Oct. 28, 2014, in counterpart Japanese Patent Application No. 2011-230008 and English translation thereof (5 pages).

*Primary Examiner* — Tan N Tran
(74) *Attorney, Agent, or Firm* — Finnegan, Henderson, Farabow, Garrett & Dunner, LLP

(57) ABSTRACT

According to one embodiment, a semiconductor device includes a semiconductor substrate having a first surface and a second surface, and having a LSI on the first surface of the semiconductor substrate, a first insulating layer with an opening, the first insulating layer provided on the first surface of the semiconductor substrate, a conductive layer on the opening, the conductive layer being connected to the LSI, and a via extending from a second surface of the semiconductor substrate to the conductive layer through the opening, the via having a size larger than a size of the opening in a range from the second surface to a first interface between the semiconductor substrate and the first insulating layer, and having a size equal to the size of the opening in the opening.

14 Claims, 15 Drawing Sheets

(51) Int. Cl.
*H01L 21/3065* (2006.01)
*H01L 21/768* (2006.01)
*H01L 23/00* (2006.01)
*H01L 21/3213* (2006.01)
*H01L 29/06* (2006.01)

(52) U.S. Cl.
CPC ........ *H01L 21/76898* (2013.01); *H01L 24/10* (2013.01); *H01L 24/11* (2013.01); *H01L 29/0649* (2013.01); *H01L 2924/13091* (2013.01)

(58) Field of Classification Search
USPC .................... 438/444, 634, 689, 734, 738
See application file for complete search history.

(56) References Cited

FOREIGN PATENT DOCUMENTS

| | | |
|---|---|---|
| JP | 2011-029491 A | 2/2011 |
| JP | 2011-108690 A | 6/2011 |

* cited by examiner

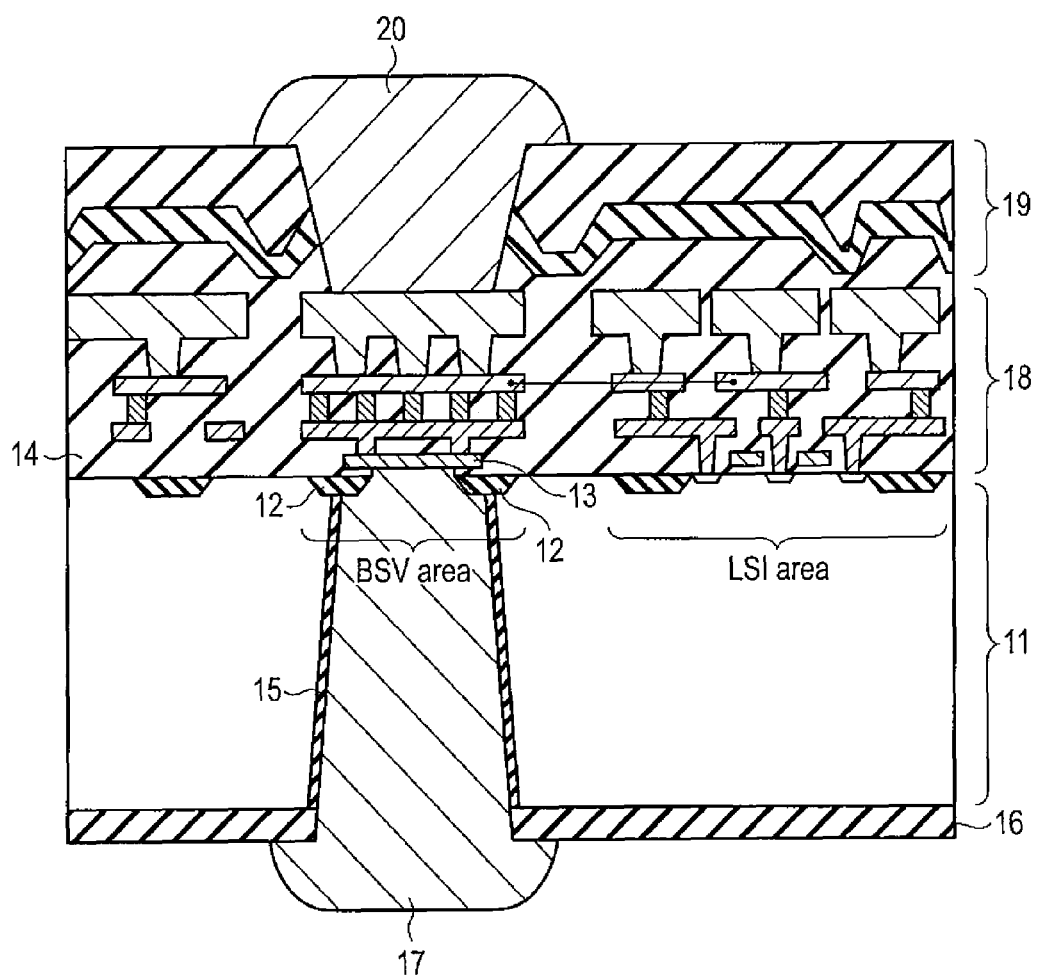
F I G. 1

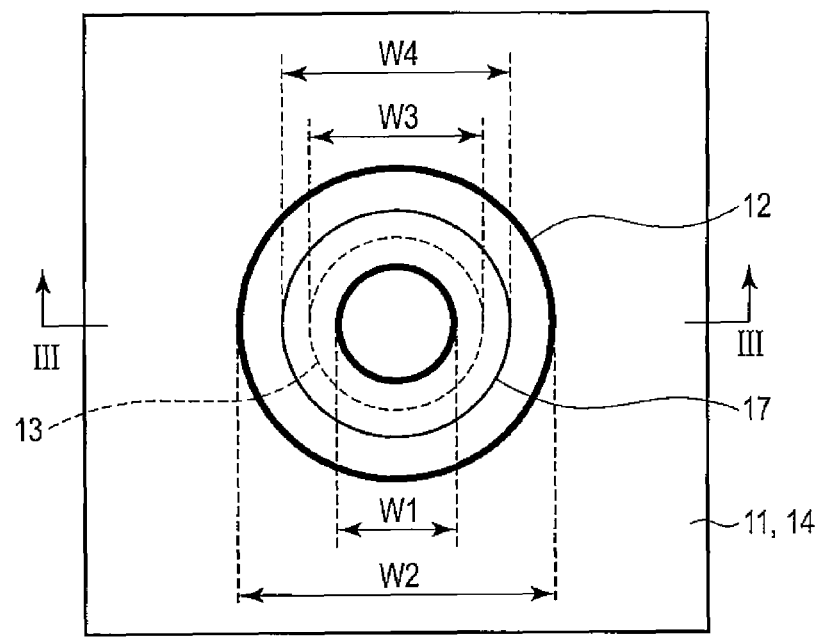
F I G. 2
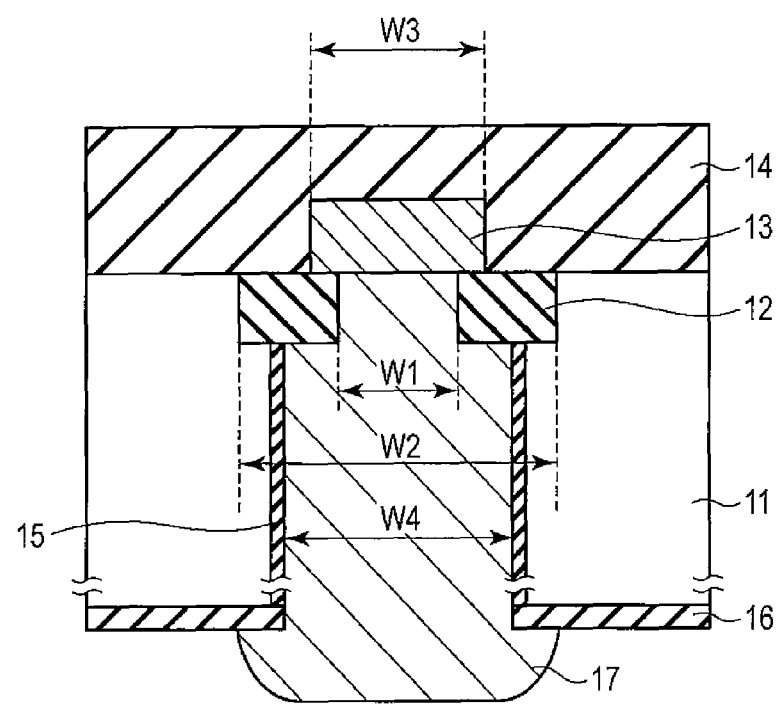
F I G. 3

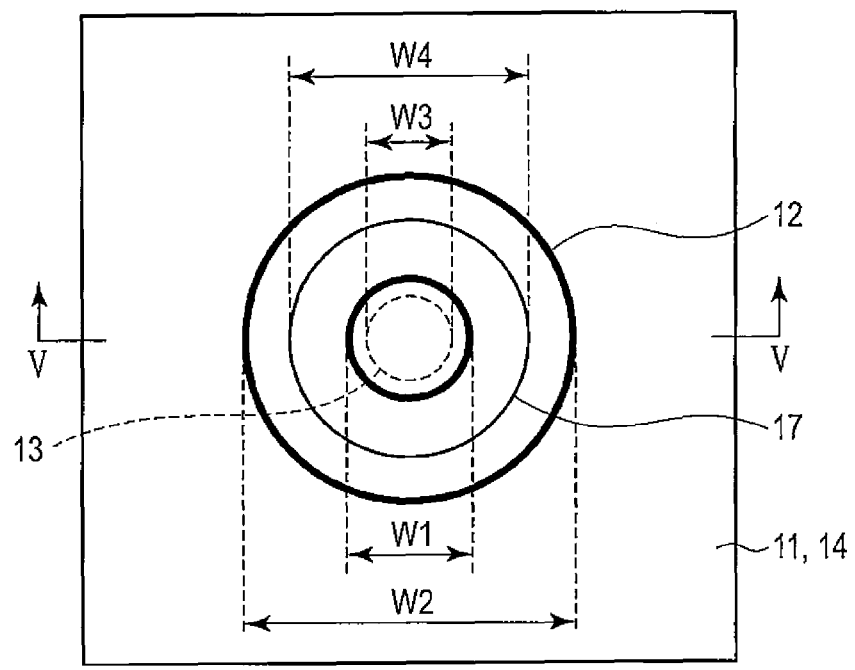
F I G. 4
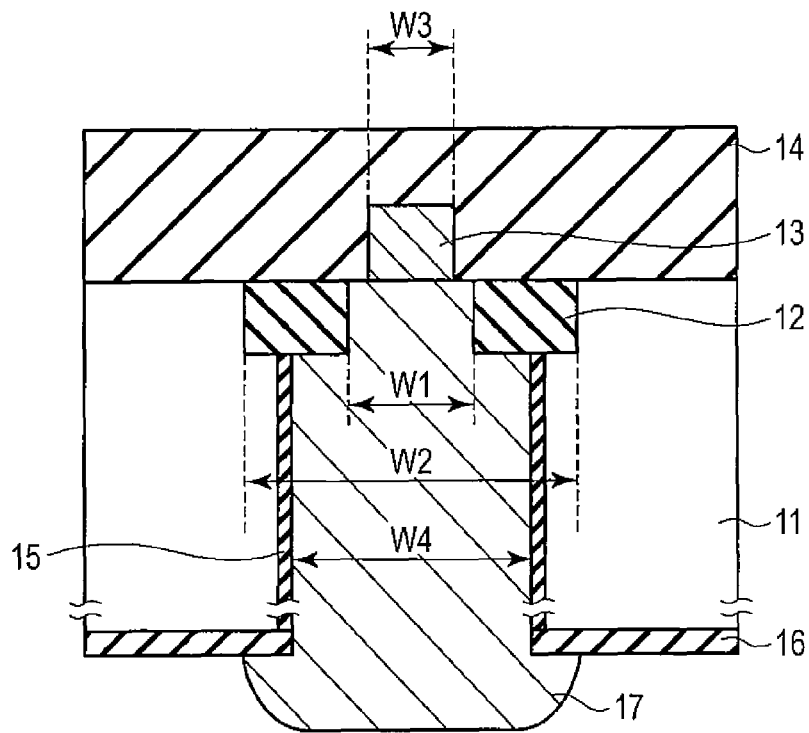
F I G. 5

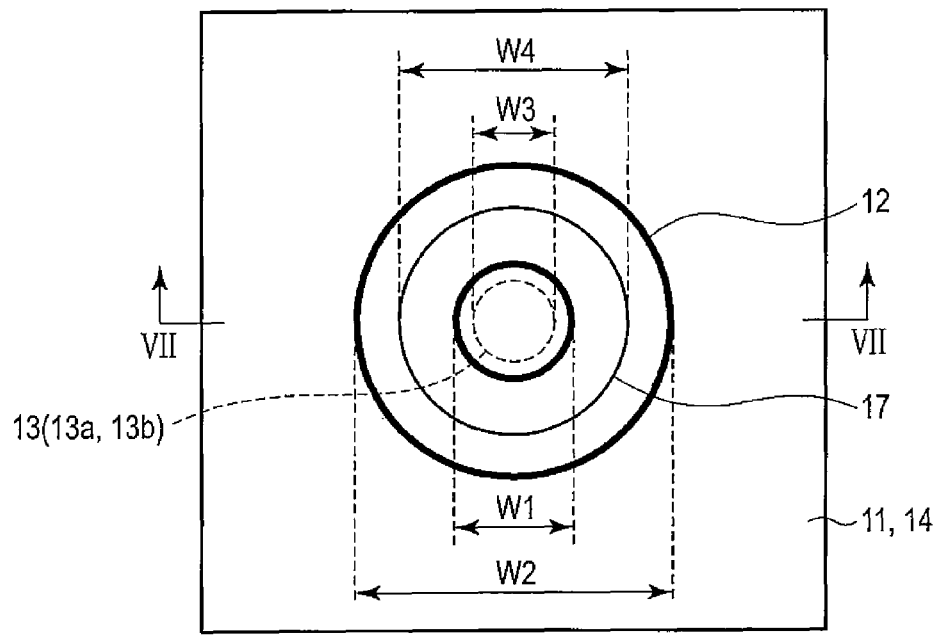
F I G. 6
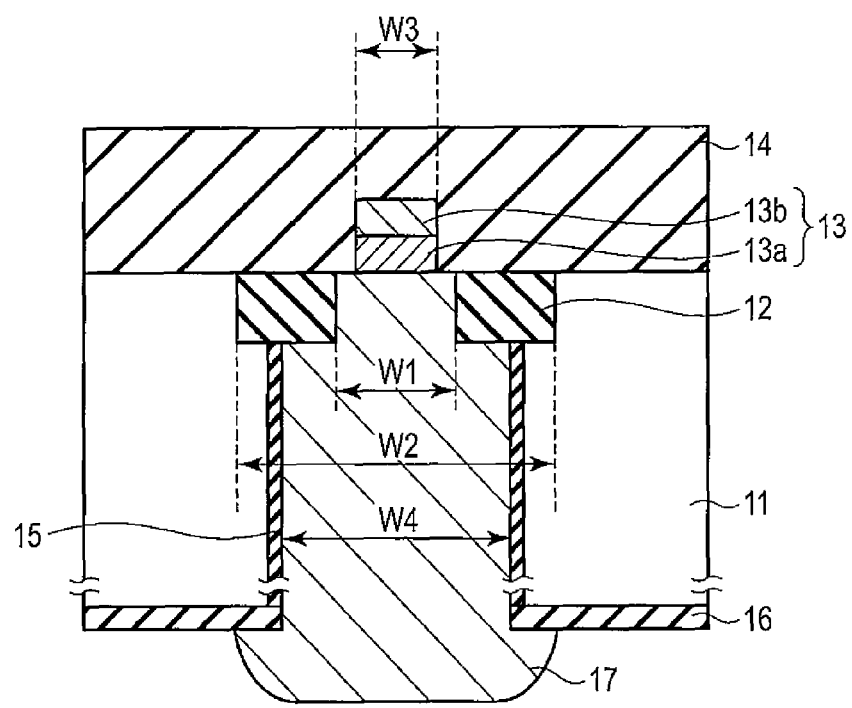
F I G. 7

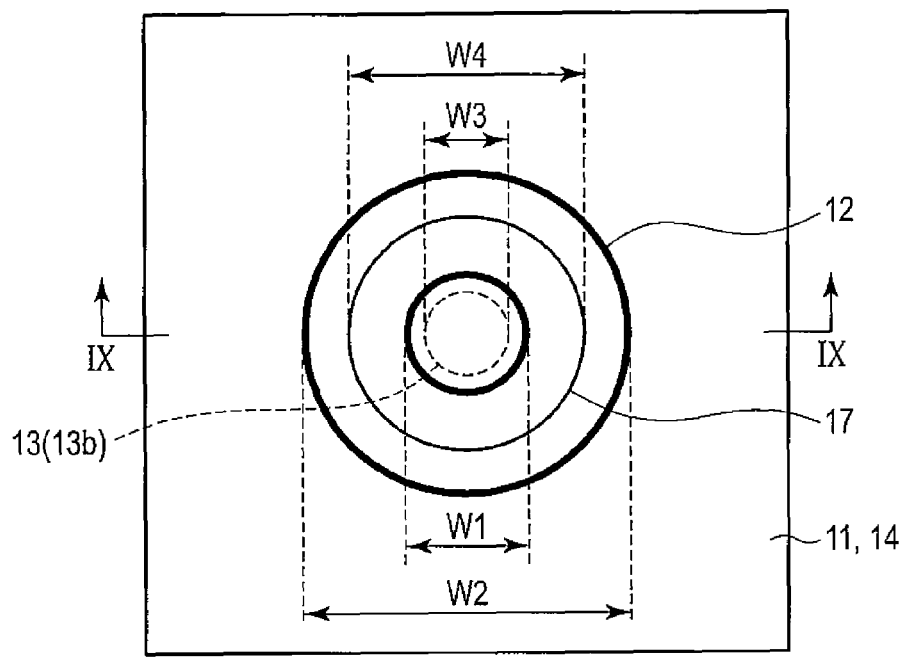
F I G. 8
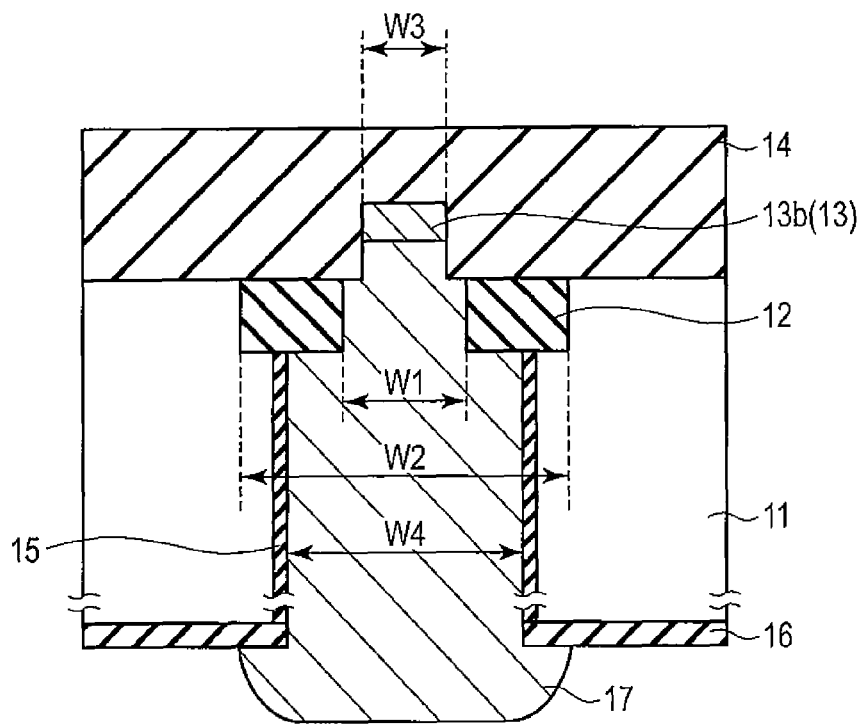
F I G. 9

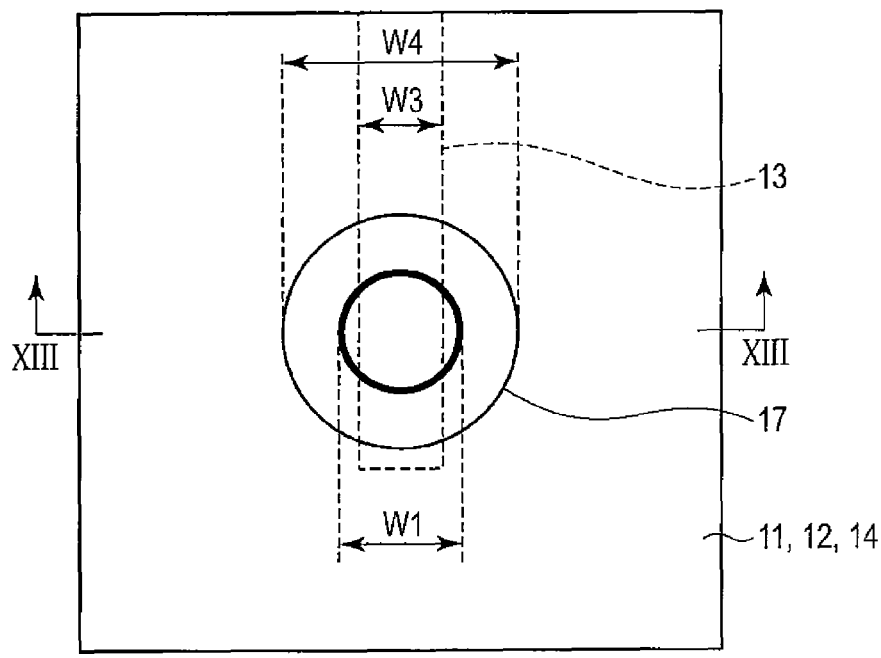
F I G. 12
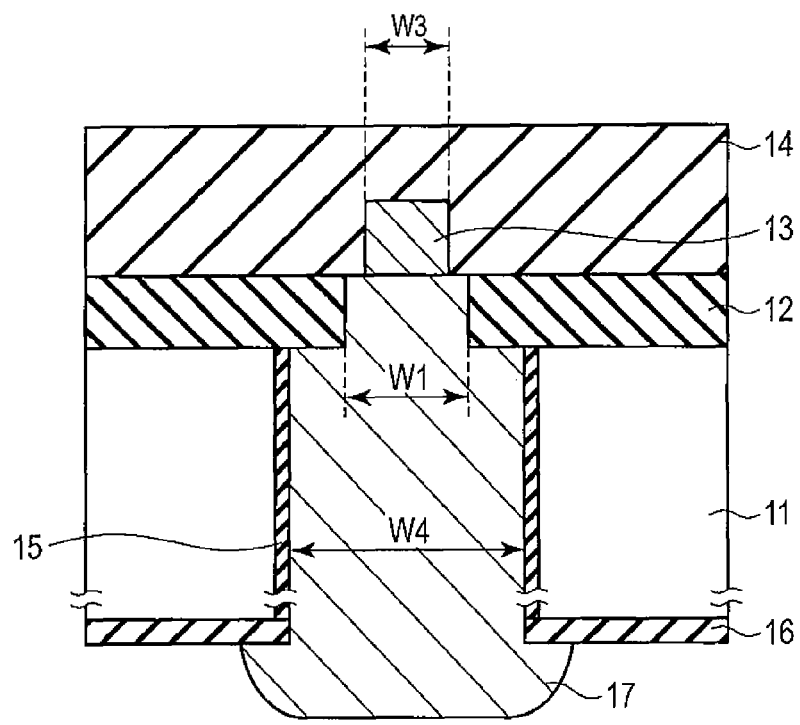
F I G. 13

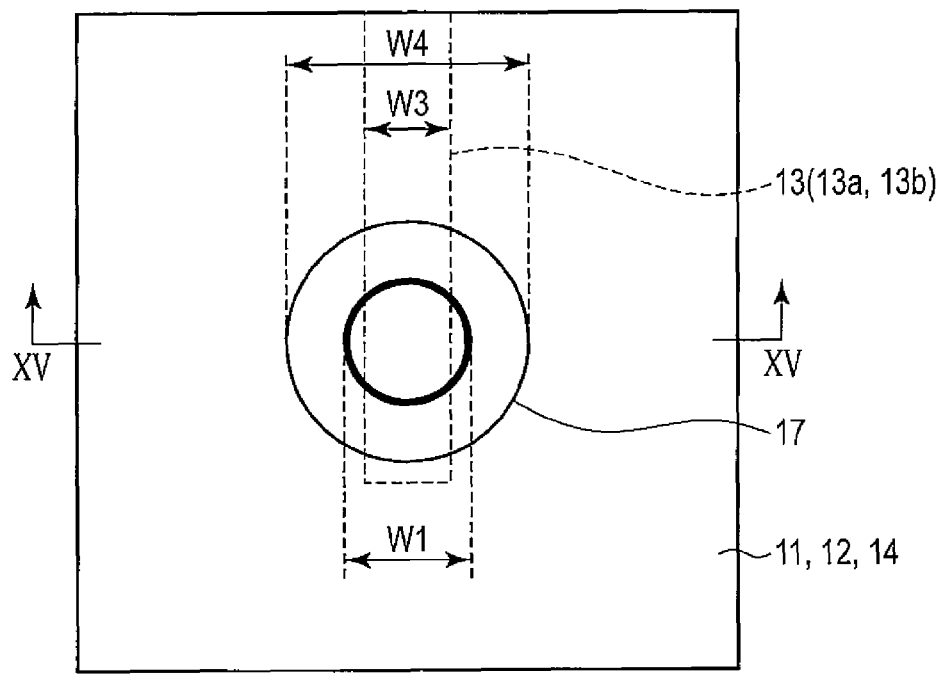
F I G. 14
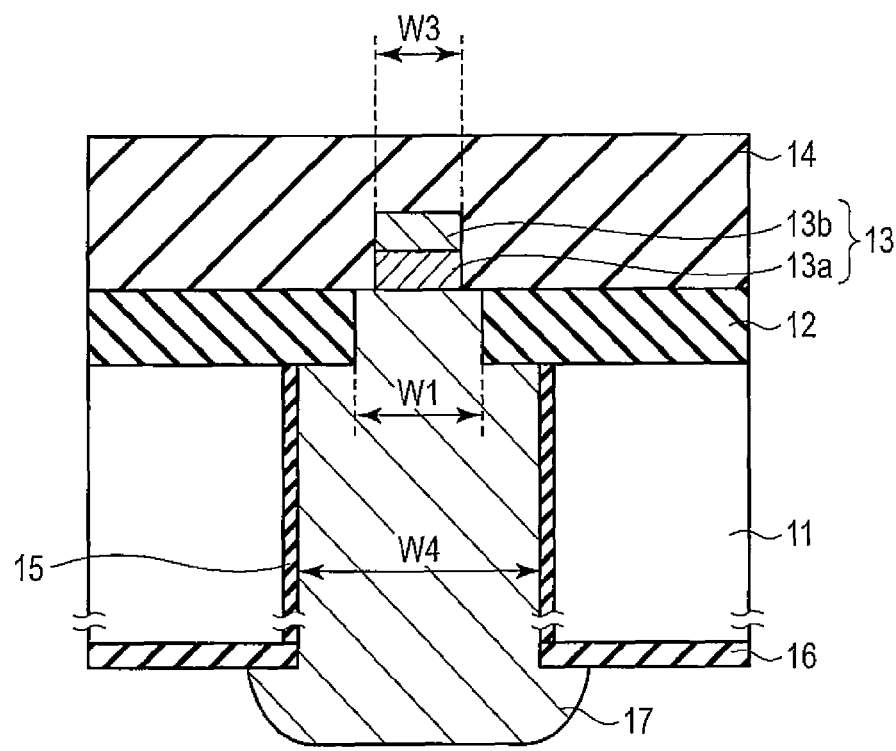
F I G. 15

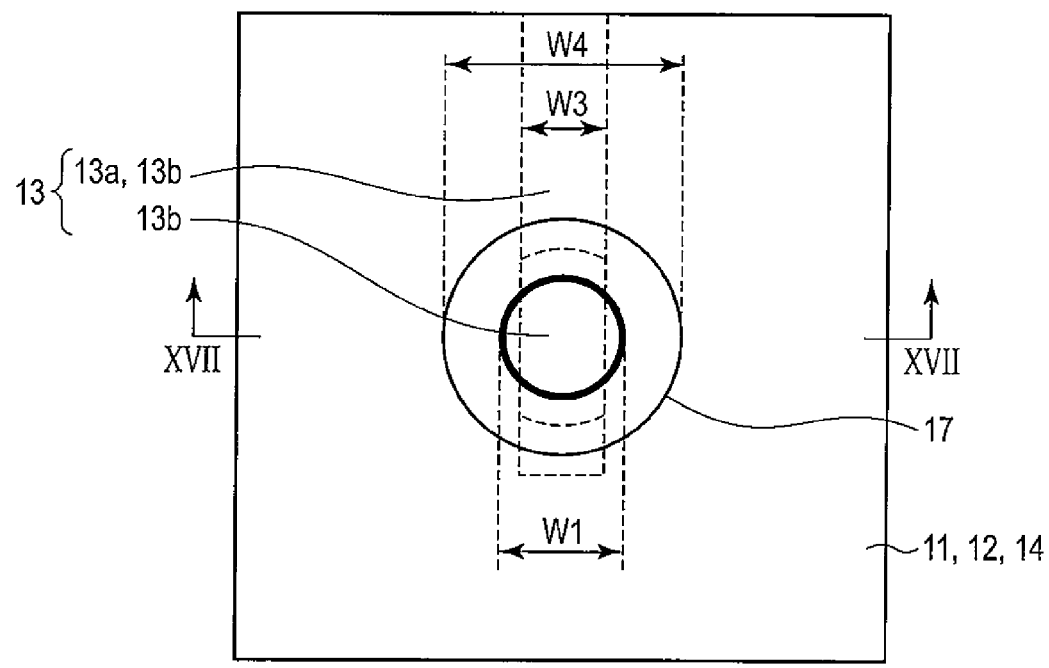
F I G. 16
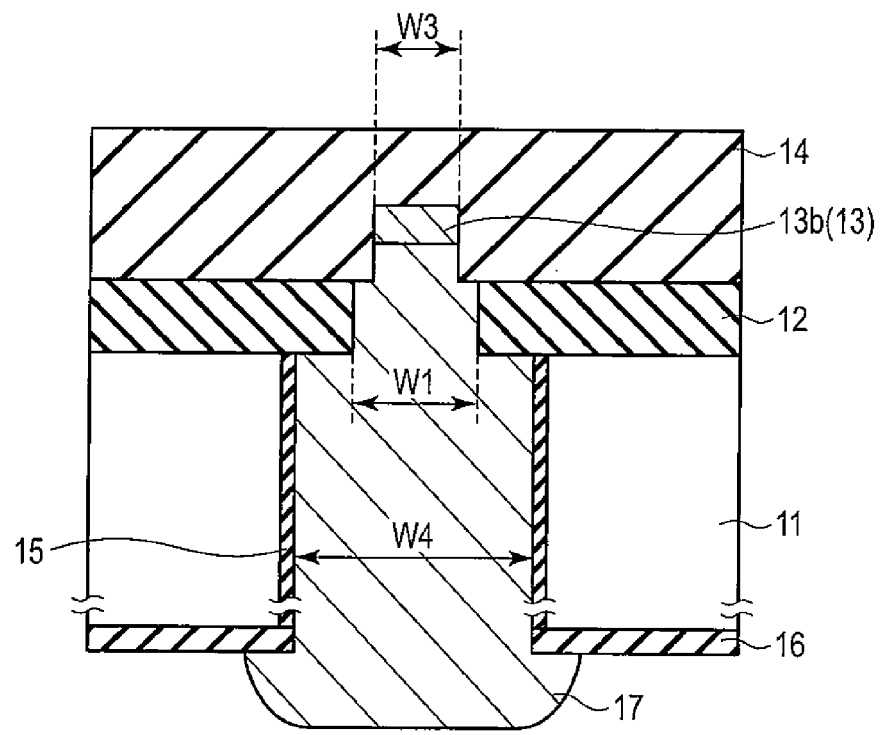
F I G. 17

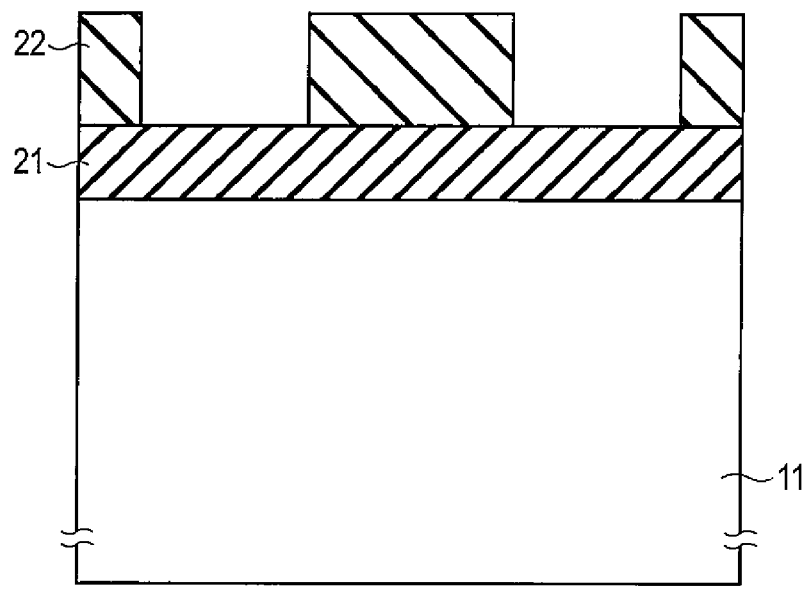
F I G. 18
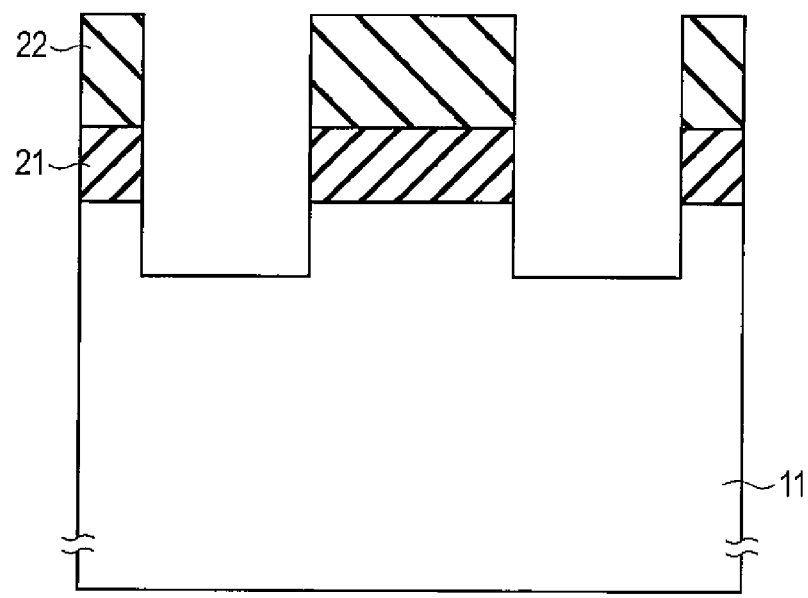
F I G. 19

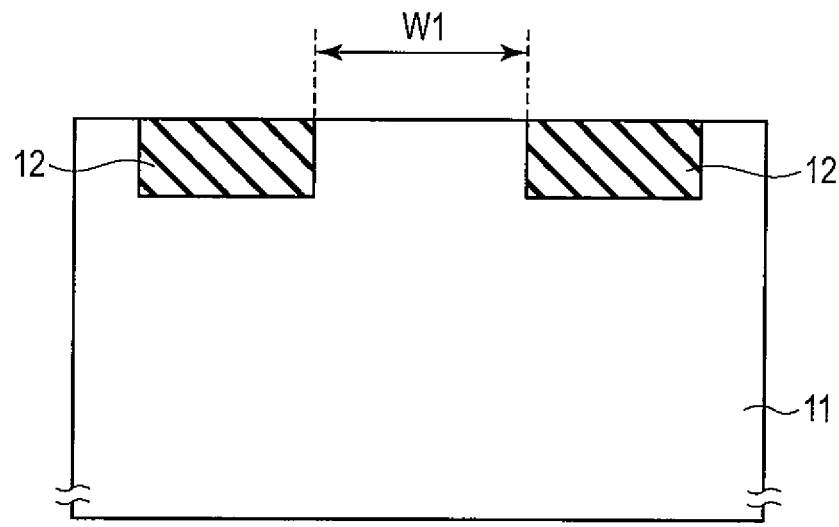
F I G. 22
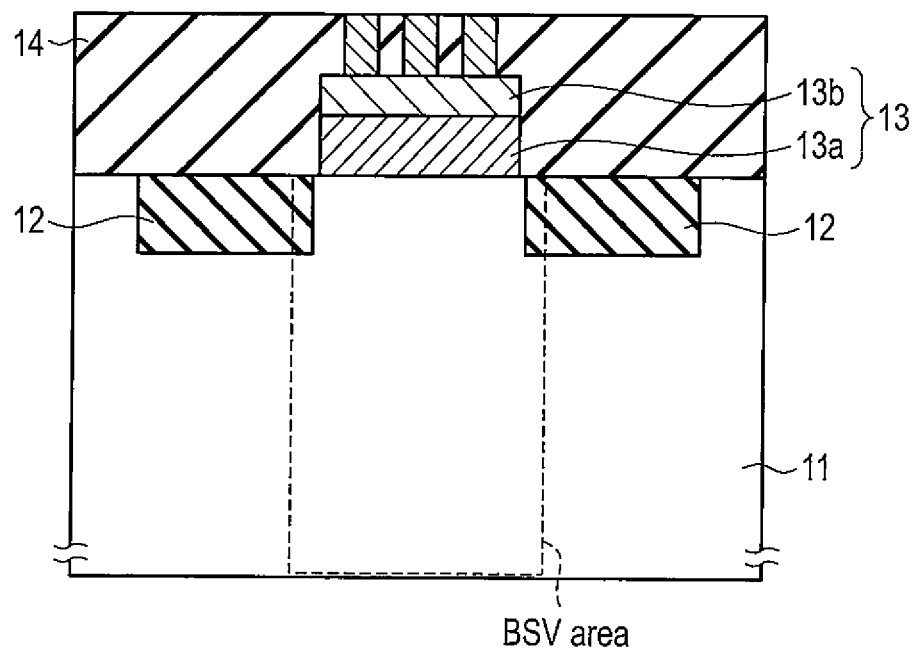
F I G. 23

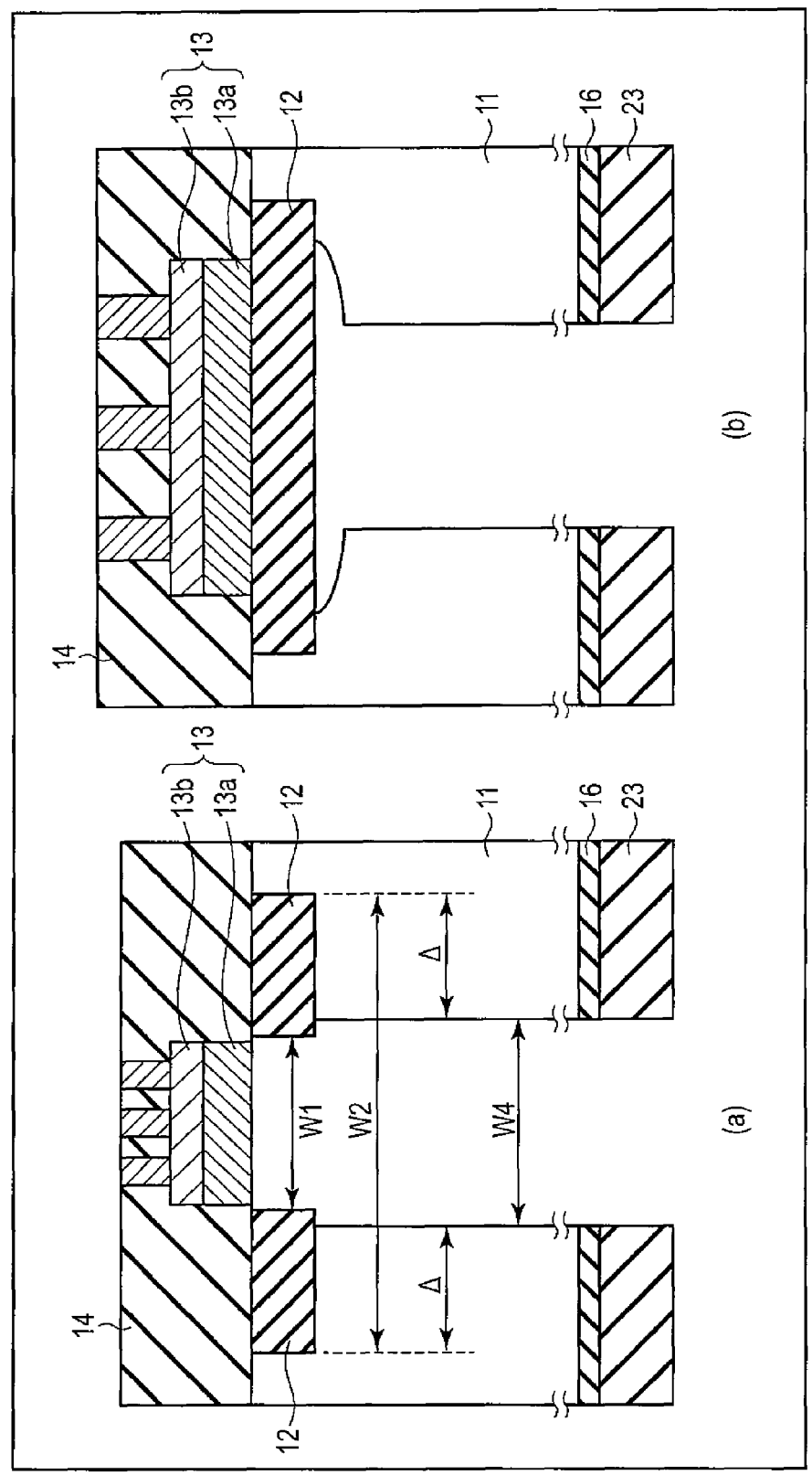
F I G. 24

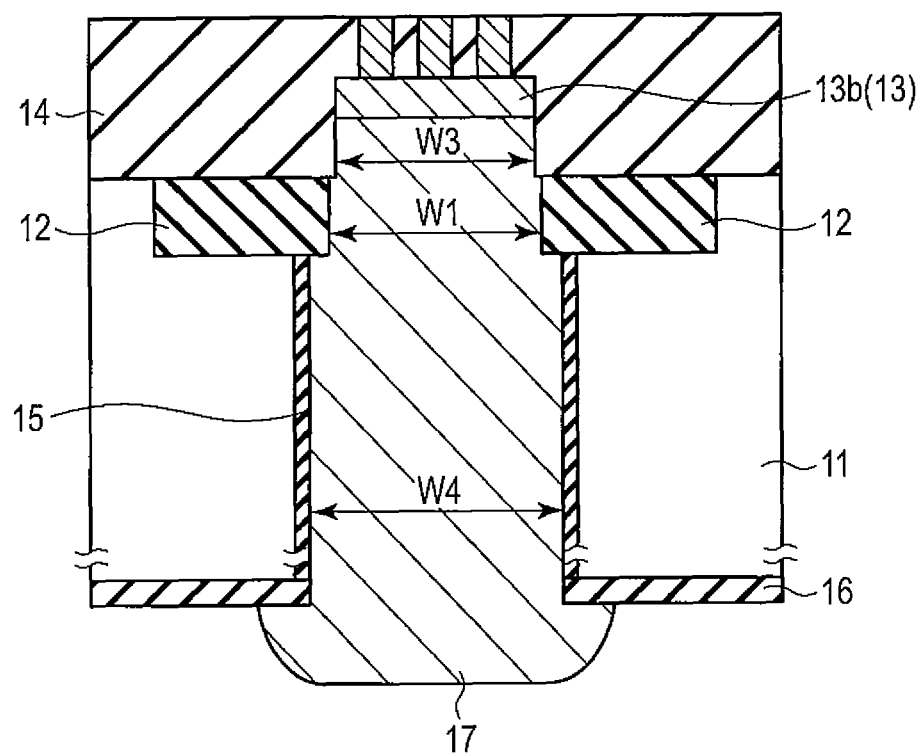
F I G. 26

SEMICONDUCTOR DEVICE AND METHOD OF MANUFACTURING THE SAME

CROSS-REFERENCE TO RELATED APPLICATIONS

This application is a division of application Ser. No. 13/593,980, filed Aug. 24, 2012, which is based upon and claims the benefit of priority from Japanese Patent Application No. 2011-230008, filed Oct. 19, 2011, the entire contents of all of which are incorporated herein by reference.

FIELD

Embodiments described herein relate generally to a semiconductor device and a method of manufacturing the same.

BACKGROUND

A technology according to which chips are stacked and these chips are mutually electrically connected by TSV (Through Silicon Via) is known. If the technology is applied to implementations of memory chips, high-speed large-capacity memory chips can apparently be realized. As a method of forming a TSV, a BSV (Backside Via hole) method by which an LSI is formed on the front side of chip and then holes are formed from the rear side of the chip on which no LSI is formed is known.

However, if the BSV method is adopted, a process of reducing the aspect ratio of holes by polishing the rear side of the chip to make the semiconductor substrate thinner is adopted. During the process, variations in thickness of the semiconductor substrate arise in accordance with the position on the rear face. Thus, if holes are formed on one chip at the same time, each hole may not be formed correctly because the depth of each hole is not the same. This results in degradation in reliability due to insufficient coverage when a conductive material is embedded in the holes.

BRIEF DESCRIPTION OF THE DRAWINGS

FIG. 1 is a sectional view showing an embodiment of a semiconductor device;

FIG. 2 is a plan view showing a first example of a TSV structure;

FIG. 3 is a sectional view along a III-III line in FIG. 2;

FIG. 4 is a plan view showing a second example of the TSV structure;

FIG. 5 is a sectional view along a V-V line in FIG. 4;

FIG. 6 is a plan view showing a third example of the TSV structure;

FIG. 7 is a sectional view along a VII-VII line in FIG. 6;

FIG. 8 is a plan view showing a fourth example of the TSV structure;

FIG. 9 is a sectional view along a IX-IX line in FIG. 8;

FIG. 12 is a plan view showing a sixth example of the TSV structure;

FIG. 13 is a sectional view along a XIII-XIII line in FIG. 12;

FIG. 14 is a plan view showing a seventh example of the TSV structure;

FIG. 15 is a sectional view along a XV-XV line in FIG. 14;

FIG. 16 is a plan view showing an eighth example of the TSV structure;

FIG. 17 is a sectional view along a XVII-XVII line in FIG. 16; and

FIGS. 18 to 26 are sectional views showing an embodiment of a manufacturing method.

DETAILED DESCRIPTION

Figure 10:
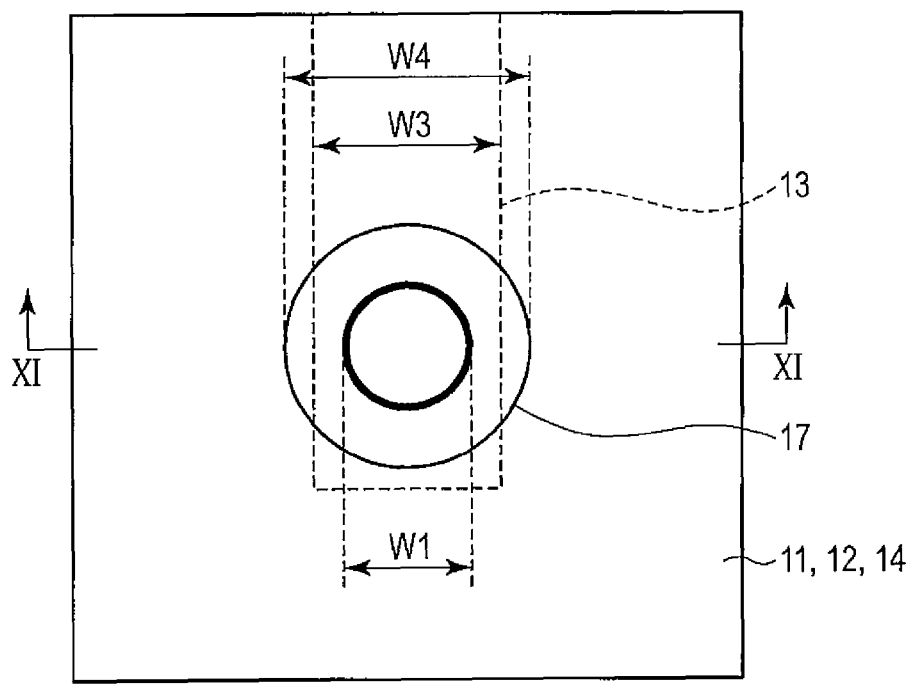
FIG. 10 is a plan view showing a fifth example of the TSV structure.

In general, according to one embodiment, a method of manufacturing a semiconductor device, the method comprises: forming an insulating layer with an opening on a first surface of a semiconductor substrate; forming a LSI on the first surface of the semiconductor substrate; forming a conductive layer on the opening, the conductive layer being connected to the LSI; forming a hole extending from a second surface of the semiconductor substrate to the conductive layer through the opening by selectively etching the semiconductor substrate from the second surface of the semiconductor substrate, the hole having a size larger than a size of the opening in a range from the second surface to an interface between the semiconductor substrate and the insulating layer, and having a size equal to the size the opening in the opening; and forming a via in the hole.

In addition, a semiconductor device comprising: a semiconductor substrate having a first surface and a second surface, and having a LSI on the first surface of the semiconductor substrate; a first insulating layer with an opening, the first insulating layer provided on the first surface of the semiconductor substrate; a conductive layer on the opening, the conductive layer being connected to the LSI; and a via extending from a second surface of the semiconductor substrate to the conductive layer through the opening, the via having a size larger than a size of the opening in a range from the second surface to a first interface between the semiconductor substrate and the first insulating layer, and having a size equal to the size the opening in the opening.

An embodiment will be described below with reference to the drawings.

The embodiment relates to a technology for forming a TSV of a BSV system.

When holes are formed from the rear side of a semiconductor substrate (for example, a silicon substrate) by, for example, anisotropic etching, an insulating layer (for example, a silicon oxide layer) as an etching stopper is generally provided at the bottom of the holes.

However, while the thickness of the semiconductor substrate after the rear face is polished is, for example, 40 to 50 µm, the thickness of the insulating layer as an etching stopper is about 0.3 µm. Thus, if the etching time of the semiconductor substrate is increased in consideration of variations in thickness caused in the semiconductor substrate, the insulating layer is over-etched and may not be able to function adequately as an etching stopper. If an etching condition under which an etching selection ratio of the semiconductor substrate and insulating layer is sufficiently large is adopted, an etchant loses anisotropy in a hole in which the bottom reaches the insulating layer, leading to an occurrence of etching in a lateral direction (side etching).

Thus, in a manufacturing method according to the embodiment, an insulating layer functioning as an etching stopper when a hole (BSV) is formed and having an opening is formed in advance on the front side of the semiconductor substrate to prevent the above problems. Moreover, a conductive layer to which a via (TSV) is connected is arranged on an opening of the insulating layer.

If the semiconductor substrate is selectively etched in this state to form a hole reaching the conductive layer from the rear side of the semiconductor substrate via the opening of the insulating layer, the semiconductor substrate is further present in the opening of the insulating layer in a hole in which the bottom reaches the insulating layer, resulting in over-etching of the semiconductor substrate in the opening. That is, side etching does not occur when forming a hole (BSV). Also, side etching does not occur in a hole in which the bottom reaches the conductive layer because the hole is surrounded by the insulating layer.

If the above technology is adopted, a via can be embedded in a hole in good coverage conditions and therefore, a highly reliable TSV of the BSV method can be realized.

To carry out the above manufacturing method, the size of a hole is made larger than the size of an opening in the range from the rear face of the semiconductor substrate to the interface between the semiconductor substrate and the insulating layer. Accordingly, the size of the hole becomes equal to the size of the opening self-aligningly inside the opening and also changes discontinuously in the interface between the semiconductor substrate and the insulating layer.

The size of a hole means the size when the hole is viewed from the rear side of the semiconductor substrate and partially formed notches and micro irregularities are excluded. A discontinuous change means an abrupt stepwise change, instead of a linear change of the size of a hole.

Thus, a hole can self-aligningly be formed on the conductive layer and still higher reliability can be realized by improving matching precision of both.

[Semiconductor Device]

FIG. 1 shows a semiconductor device according to the embodiment.

Semiconductor substrate 11 is, for example, a silicon substrate. The thickness of semiconductor substrate 11 is in the range of, for example, 40 to 50 μm. A semiconductor integrated circuit is formed inside an LSI area on the front side of semiconductor substrate 11. Also, insulating layer 12 functioning as an etching stopper when a hole (BSV) is formed is formed inside a BSV area on the front side of semiconductor substrate 11.

Insulating layer 12 is, for example, a silicon oxide layer and the thickness thereof is about 0.3 μm. For example, a portion of an element isolation insulating layer or example, STI-insulator: Shallow Trench isolation-insulator) that isolates elements constituting a semiconductor integrated circuit inside the LSI area may be adopted as insulating layer 12.

Insulating layer 12 has an opening. Conductive layer 13 to which a via (back bump) 17 is connected is arranged on the opening of insulating layer 12 and connected to a semiconductor integrated circuit inside the LSI area. Conductive layer 13 is formed at the same time as, for example, a gate electrode of a MOS transistor inside the LSI area.

Conductive layer 13 is covered with insulating layer (interlayer dielectric) 14. Conductive layer 13 includes, for example, a conductive polysilicon layer, a metal silicide, or a laminated structure thereof. Insulating layer 14 is, for example, a silicon oxide layer.

Via 17 is connected to conductive layer 13 from the rear side of semiconductor substrate 11 via the opening of insulating layer 12. Insulating layer 15 to insulate semiconductor substrate 11 from via 17 is formed therebetween. Insulating layer 15 is, for example, a silicon oxide layer.

The size of via 17 is larger than the size of the opening in the range from the rear face of semiconductor substrate 11 to the interface between semiconductor substrate 11 and insulating layer 12 and is equal to the size of the opening in the opening. The size of via 17 changes discontinuously in the interface between semiconductor substrate 11 and insulating layer 12.

The size of via 17 means the size when via 17 is viewed from the rear side of semiconductor substrate 11. If, for example, via 17 has a circle shape, the size of via 17 is the diameter thereof and if via 17 has a square shape, the size of via 17 is the size of one side thereof. The size of via 17 does not include unintended notches due to side etching cited as one of conventional problems.

Similarly, the size of an opening means the size when the opening of insulating layer 12 is viewed from the rear side of semiconductor substrate 11. If, for example, the opening has a circle shape, the size of the opening is the diameter thereof and if the opening has a square shape, the size of the opening is the size of one side thereof.

Passivation layer (insulating layer) 16 is formed on the rear side of semiconductor substrate 11. Wiring layer 18 and passivation layer 19 are formed on the front side of semiconductor substrate 11. Surface bump 20 connected to conductive layer 13 is formed on the front side of semiconductor substrate 11. Surface bump 20 is desirably arranged immediately on conductive layer 13.

Next, a structure example of via 17 of the semiconductor device in FIG. 1 will be described.

FIGS. 2 and 3 show a first example of the TSV structure.

FIG. 3 is a sectional view along a line in FIG. 2.

Insulating layer 12 having an opening and conductive layer 13 on the opening of insulating layer 12 are formed on the front side of semiconductor substrate 11. Conductive layer 13 is covered with insulating layer 14.

The size of the opening of insulating layer 12 is W1. Insulating layer 12 is in an island shape and the size of insulating layer 12 is W2. In the present example, insulating layer 12 and the opening thereof have both a circle shape and insulating layer 12 has a ring shape. That is, W1 is the inside diameter of the ring and W2 is the outside diameter of the ring.

The size of conductive layer 13 is W3. In the present example, conductive layer 13 has a circle shape and has a relationship of W1<W3<W2.

The size of via 17 is W4 in the range from the rear face of semiconductor substrate 11 to the interface between semiconductor substrate 11 and insulating layer 12. In the present example, via 17 has a circle shape and has a relationship of W1<W4<W2. The size of via 17 is equal to size W1 the opening in the opening and changes discontinuously in the interface between semiconductor substrate 11 and insulating layer 12.

In this structure, the bottom of via 17 is surrounded by insulating layer 12 and therefore, no side etching occurs when a hole (BSV) is formed.

FIGS. 4 and 5 show a second example of the TSV structure.

FIG. 5 is a sectional view along a V-V line in FIG. 4.

The present example is a modification of the first example. The present example is different from the first example only in size W3 of conductive layer 13. Otherwise, the present example is the same as the first example and thus, a description thereof is omitted.

In the present example, size W3 of conductive layer 13 is smaller than size W1 of the opening of insulating layer 12. Also in this structure, the bottom of via 17 is surrounded by insulating layers 12, 14 and therefore, no side etching occurs when a hole (BSV) is formed.

FIGS. 6 and 7 show a third example of the TSV structure.

FIG. 7 is a sectional view along a VII-VII line in FIG. 6.

The present example is a modification of the second example. The present example is different from the second example only in that conductive layer 13 includes layers. Otherwise, the present example is the same as the second example and thus, a description thereof is omitted.

In the present example, conductive layer 13 includes first layer (for example, a conductive polysilicon layer) 13a and second layer (for example, a metal silicide) 13b. Also in this structure, the bottom of via 17 is surrounded by insulating layers 12, 14 and therefore, no side etching occurs when a hole (BSV) is formed.

FIGS. 8 and 9 show a fourth example of the TSV structure.

FIG. 9 is a sectional view along a IX-IX line in FIG. 8.

The present example is a modification of the third example. The present example is different from the third example in that conductive layer 13 includes only second layer 13b (in that first layer 13a in FIG. 7 is removed). Otherwise, the present example is the same as the third example and thus, a description thereof is omitted.

In the present example, conductive layer 13 includes the first and second layers before a hole (BSV) is formed. However, when a hole is formed, the first layer constituting conductive layer 13 is removed. As a result, conductive layer 13 includes only second layer (for example, a metal silicide) 13b.

In this case, the size of via 17 is equal to size W3 of conductive layer 13b in the range from the interface between insulating layers 12, 14 to conductive layer 13b and changes discontinuously in the interface between insulating layers 12, 14.

Also in this structure, the bottom of via 17 is surrounded by insulating layers 12, 14 and therefore, no side etching occurs when a hole (BSV) is formed.

Figure 11:
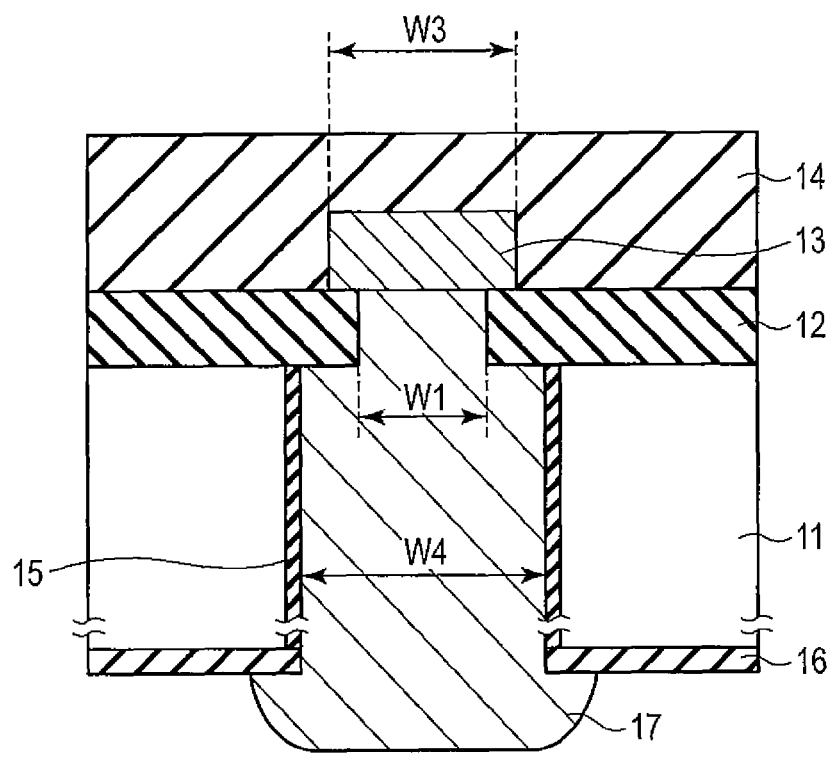
FIG. 11 is a sectional view along a XI-XI line in FIG. 10.

FIGS. 10 and 11 show a fifth example of the TSV structure.

FIG. 11 is a sectional view along a XI-XI line in FIG. 10.

Insulating layer 12 having an opening and conductive layer 13 on the opening of insulating layer 12 are formed on the front side of semiconductor substrate 11. Conductive layer 13 is covered with insulating layer 14.

The opening of insulating layer 12 is a circular hole and the size thereof is W1. Conductive layer 13 is a conductive wire on insulating layer 12 and the size (wire width) thereof is W3. Size W3 of conductive layer 13 is larger than size W1 of the opening.

The size of via 17 is W4 in the range from the rear face of semiconductor substrate 11 to the interface between semiconductor substrate 11 and insulating layer 12. In the present example, via 17 has a circle shape and has a relationship of W1<W4. The size of via 17 is equal to size W1 of the opening in the opening and changes discontinuously in the interface between semiconductor substrate 11 and insulating layer 12.

In this structure, the bottom of via 17 is surrounded by insulating layer 12 and therefore, no side etching occurs when a hole (BSV) is formed.

FIGS. 12 and 13 show a sixth example of the TSV structure.

FIG. 13 is a sectional view along a XIII-XIII line in FIG. 12.

The present example is a modification of the fifth example. The present example is different from the fifth example only in size W3 of conductive layer 13 as a conductive wire. Otherwise, the present example is the same as the fifth example and thus, a description thereof is omitted.

In the present example, size W3 of conductive layer 13 as a conductive wire is smaller than size W1 of the opening of insulating layer 12. Also in this structure, the bottom of via 17 is surrounded by insulating layers 12, 14 and therefore, no side etching occurs when a hole (BSV) is formed.

FIGS. 14 and 15 show a seventh example of the TSV structure.

FIG. 15 is a sectional view along a XV-XV line in FIG. 14.

The present example is a modification of the sixth example. The present example is different from the sixth example only in that conductive layer 13 as a conductive wire includes layers. Otherwise, the present example is the same as the sixth example and thus, a description thereof is omitted.

In the present example, conductive layer 13 as a conductive wire includes first layer (for example, a conductive polysilicon layer) 13a and second layer (for example, a metal silicide) 13b. Also in this structure, the bottom of via 17 is surrounded by insulating layers 12, 14 and therefore, no side etching occurs when a hole (BSV) is formed.

FIGS. 16 and 17 show an eighth example of the TSV structure.

FIG. 17 is a sectional view along a XVII-XVII line in FIG. 16.

The present example is a modification of the seventh example. The present example is different from the seventh example in that conductive layer 13 includes only second layer 13b (in that first layer 13a in FIG. 15 is partially removed on the opening). Otherwise, the present example is the same as the seventh example and thus, a description thereof is omitted.

In the present example, conductive layer 13 includes the first and second layers before a hole (BSV) is formed. However, when a hole is formed, a portion of the first layer constituting conductive layer 13 is removed. As a result, conductive layer 13 includes only second layer (for example, a metal silicide) 13b on the opening.

In this case, the size of via 17 is equal to size W3 of conductive layer 13b in the range from the interface between insulating layers 12, 14 to conductive layer 13b and changes discontinuously in the interface between insulating layers 12, 14.

Also in this structure, the bottom of via 17 is surrounded by insulating layers 12, 14 and therefore, no side etching occurs when a hole (BSV) is formed.

[Manufacturing Method]

Next, the manufacturing method of a semiconductor device will be described.

In the description that follows, the manufacturing method of a semiconductor device according to the fourth example of the TSV structure shown in FIGS. 8 and 9 is taken as an example. Other structures can easily be manufactured by appropriately changing the following example.

First, as shown in FIG. 18, insulating layer (for example, a silicon nitride layer) 21 is formed on the surface of semiconductor substrate 11. Also, photoresist layer 22 is formed on insulating layer 21 by PEP (Photo Engraving Process). If insulating layer 21 and semiconductor substrate 11 are etched by anisotropic etching (for example, RIE) using photoresist layer 22 as a mask, as shown in FIG. 19, trench is formed inside semiconductor substrate 11.

The depth from the surface of semiconductor substrate 11 to the bottom of the trench is set to about 0.3 μm.

Then, photoresist layer 22 is removed.

Figure 20:
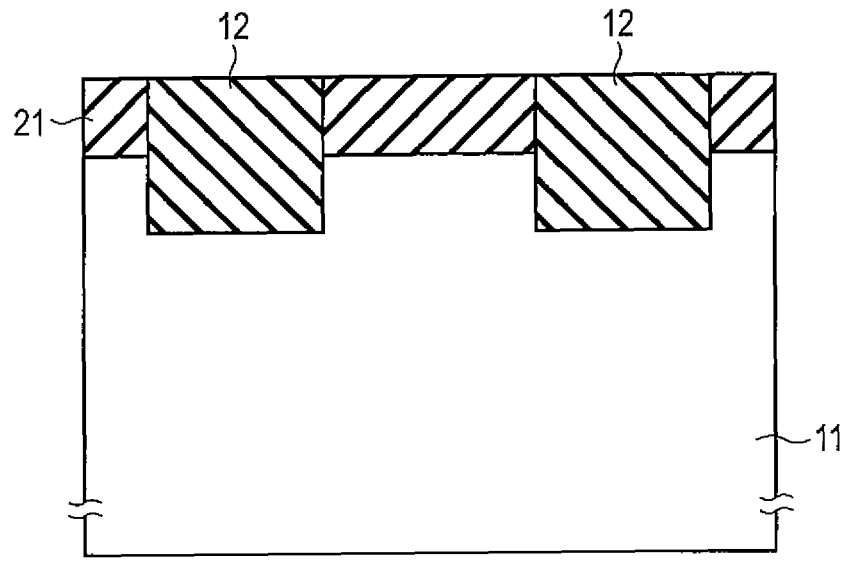

Next, as shown in FIG. 20, the trench is filled with insulating layer (for example, a silicon oxide layer) 12. Insulating layer 12 outside the trench is removed by, for example, CMP (Chemical Mechanical Polishing). CMP uses insulating layer 21 as a stopper to perform polishing and planarization of insulating layer 12.

Figure 21:
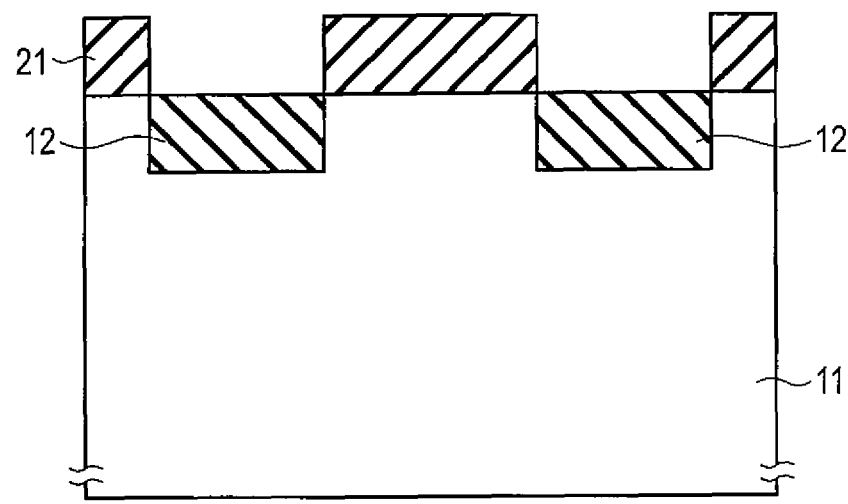

Subsequently, as shown in FIG. 21, insulating layer 12 is etched inside the trench by, for example, wet etching and the position of the surface of insulating layer 12 is adjusted to the same level as that of the position of the surface of semiconductor substrate 11. Then, if insulating layer 21 is removed, as shown in FIG. 22, insulating layer (etching stopper for forming BSV) 12 in a ring shape whose opening has size W1 is formed.

Incidentally, it is desirable to form insulating layer 12 simultaneously with an element isolation insulating layer that isolates elements constituting a semiconductor integrated circuit (LSI).

Next, as shown in FIG. 23, conductive layer 13 in an island shape is formed on the opening of insulating layer 12 on the front side of semiconductor substrate 11. Conductive layer 13 includes first layer (for example, a conductive polysilicon layer) 13a and second layer (for example, an NiSi layer) 13b.

Then, a wiring layer and a passivation layer are formed on the front side of semiconductor substrate 11 by a general backend process and further, a surface bump is formed (see FIG. 1).

The rear face of semiconductor substrate 11 is polished to set the thickness of semiconductor substrate 11 to within the range of 40 to 50 μm.

Next, as shown in (a) of FIG. 24, passivation layer 16 is formed on the rear face of semiconductor substrate 11. Photoresist 23 is formed on passivation layer 16 by PEP. A hole (BSV) is formed in semiconductor substrate 11 by selectively etching passivation layer 16 and semiconductor substrate 11 by anisotropic etching (for example, RIE) using photoresist 23 as a mask.

The etching is performed under a condition under which the etching selection ratio of semiconductor substrate 11 and insulating layer 12 is sufficiently large. If an etching gas containing, for example, HE", $SF_6$, $SiF_4$, or $O_2$ is used, a sufficiently large etching selection ratio so that only silicon as semiconductor substrate 11 is etched while silicon oxide as insulating layer 12 is hardly etched can be obtained.

The size of a hole is set to value W4 larger than size W1 of the opening of insulating layer 12 in the range from the rear face of semiconductor substrate 11 to the interface between semiconductor substrate 11 and insulating layer 12. However, it is desirable to set a size difference Δ (=(W2−W4)/2) of a hole and insulating layer 12 to 1 μm or more to prevent the hole from being detached from insulating layer 12 due to matching shifts of the hole and insulating layer 12.

Accordingly, even if the bottom of a hole reaches insulating layer 12, semiconductor substrate 11 is present in the opening of insulating layer 12 and thus, semiconductor substrate 11 is over-etched and no side etching occurs.

Moreover, even if the bottom of a hole reaches conductive layer 13, the hole surrounded by insulating layers 12, 14 and no side etching occurs.

Further, the size of a hole becomes equal to size W1 of the opening in the opening of insulating layer 12. That is, the hole and conductive layer 13 are aligned self-aligningly and therefore, reliability of a semiconductor device can be improved.

Incidentally, etching conditions for forming a hole (BSV) may remain constant during etching or may be changed while etching is performed.

For example, semiconductor substrate 11 may be etched at high speed until insulating layer 12 is exposed under a first condition (etching rate Er1 of semiconductor substrate 11) and after insulating layer 12 is exposed, semiconductor substrate 11 in the opening may be etched under a second condition (etching rate Er2 (<Er1) of semiconductor substrate 11).

Figure 25:
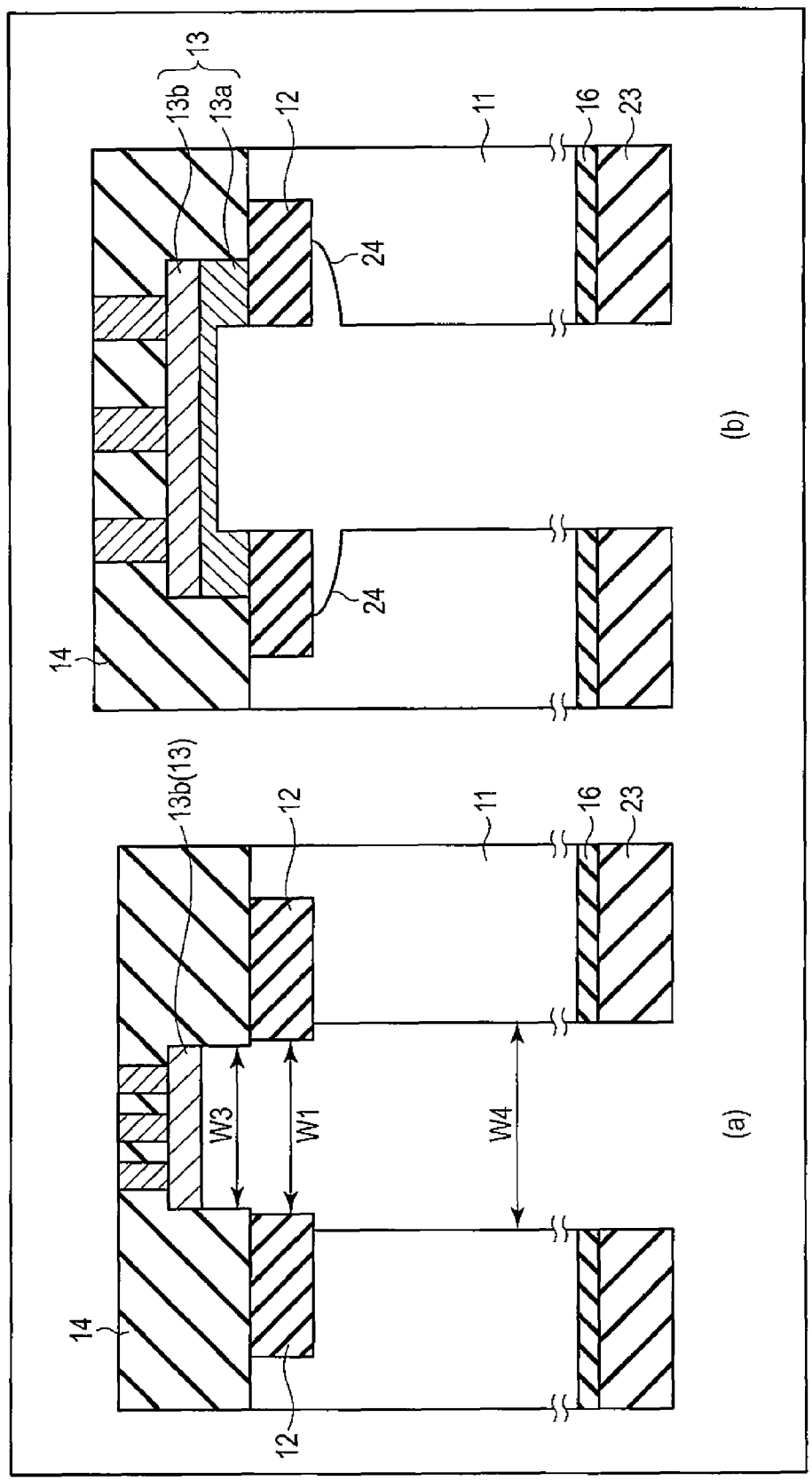

Next, as shown in (a) of FIG. 25, a portion of conductive layer 13 is selectively removed.

In the present example, first layer 13a of conductive layer 13 is removed. This is because, for example, when conductive layer 13 is formed simultaneously with a gate electrode of a MOS transistor constituting a semiconductor integrated circuit (LSI), conductive layer 13 may have a laminated structure of a conductive polysilicon layer and a metal silicide.

In this case, if the conductive polysilicon layer as first layer 13a is removed, a via can directly be brought into contact with a low-resistance metal silicide, which is very effective to achieve high performance by making the wire resistance lower.

As a result, the size of a hole is equal to size W3 of conductive layer 13b in the range from the interface between insulating layers 12, 14 to conductive layer 13b and changes discontinuously in the interface between insulating layers 12, 14.

Etching of first layer 13a is performed under a condition under which the etching selection ratio of first layer 13a and second layer 13b becomes sufficiently large.

If an etching gas containing, for example, HBr, $SF_6$, $SiF_4$, or $O_2$ is used, a sufficiently large etching selection ratio so that only conductive polysilicon as first layer 13a is etched while a metal silicide as second layer 13b is hardly etched can be obtained.

Moreover, etching of first layer 13a can be performed successively after etching of semiconductor substrate 11 shown in (a) of FIG. 24.

In a comparative example using insulating layer 12 having no opening as an etching stopper for forming hole as shown in (b) of FIG. 24, by contrast, silicon as semiconductor substrate 11 is selectively etched by using an etching gas containing, for example, HBr, $SF_6$, $SiF_4$, or $O_2$. In this case, an etchant loses anisotropy in a hole in which the bottom reaches insulating layer 12 because semiconductor substrate 11 to be etched is no longer present immediately below, leading to an occurrence of side etching.

Then, as shown in (b) of FIG. 25, silicon oxide as insulating layer 12 is selectively etched by using an etching gas containing, for example, $CHF_3$. Further, then, the conductive polysilicon layer as first layer 13a is selectively etched by using an etching gas containing, for example, HBr, $SF_6$, $SiF_4$, or $O_2$.

As a result, unintended notch 24 is formed halfway through a hole.

Unintended notch 24 by the side etching first aggravates coverage when an insulating layer is formed on the inner surface of a hole. This invites a situation of short-circuits between metal and semiconductor substrate 11 when the metal is embedded in a hole. Moreover, notch 24 aggravates coverage when metal is embedded in a hole. This increases the resistance of a via and invites breaking of the via in the worst case, decreasing reliability of elements.

In the comparative example, etching needs to be performed by changing etching conditions after the bottom of a hole reaches insulating layer 12, making process conditions more complex.

Further, insulating layer 12 does not have any pre-formed opening and thus, a hole and conductive layer 13 cannot be aligned self-aligningly. That is, when a hole is formed, the hole and conductive layer 13 need to be aligned and precision varies from product (wafer) to product (wafer), leading to variations of product characteristics.

Lastly, as shown in FIG. 26, insulating layer (for example, a silicon oxide layer) 15 is formed on the inner surface of the hole. If, for example, a silicon oxide layer is used as insulating layer 15, the silicon oxide layer can selectively be formed in a portion where semiconductor substrate 11 is exposed of the inner surface of the hole.

A metal is embedded in the hole to form via (back bump) 17. If, for example, via 17 has a laminated structure of a barrier metal and a metal, the barrier metal is formed on the inner surface of the hole and then the metal with which the hole is completely filled.

The sizes of holes filled with metal become smaller stepwise like W4, W1, and W3. That is, metals can be embedded in good coverage conditions so that reliability of via 17 can be improved.

CONCLUSION

According to the embodiments, TSV of BSV system with a high reliability is realized.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit the inventions.

What is claimed is:

1. A method of manufacturing a semiconductor device, the method comprising:
   forming an insulating layer with an opening on a first surface of a semiconductor substrate;
   forming a semiconductor integrated circuit on the first surface of the semiconductor substrate;
   forming a conductive layer on the opening, the conductive layer being connected to the semiconductor integrated circuit;
   forming a hole extending from a second surface of the semiconductor substrate to the conductive layer through the opening by selectively etching the semiconductor substrate from the second surface of the semiconductor substrate, the hole having a size larger than a size of the opening in a range from the second surface to an interface between the semiconductor substrate and the insulating layer, and having a size equal to the size of the opening in the opening;
   forming a via in the hole; and
   selectively removing a part of the conductive layer after forming the hole,
   wherein the conductive layer comprises a first layer on the insulating layer and a second layer on the first layer, the part of the conductive layer is the first layer, and a size of the conductive layer is smaller than the size of the hole.

2. The method of claim 1,
   wherein the first layer is a conductive polysilicon layer, and the second layer is a metal silicide layer.

3. The method of claim 1,
   wherein a condition of etching the semiconductor substrate is constant from a start of the etching to a time in which the hole reaches to the conductive layer.

4. The method of claim 1,
   wherein a condition of etching the semiconductor substrate is changed before a time in which the hole reaches to the conductive layer.

5. The method of claim 1, further comprising:
   forming the insulating layer in parallel with forming an element isolation insulating layer which isolates elements in the semiconductor integrated circuit.

6. The method of claim 1, further comprising:
   forming the insulating layer and the conductive layer in an island manner.

7. The method of claim 1, further comprising:
   forming the conductive layer on the insulating layer in a line manner.

8. The method of claim 1, further comprising:
   forming the insulating layer in a ring manner.

9. The method of claim 1, further comprising:
   forming the opening in a circle or square manner.

10. A method of manufacturing a semiconductor device, the method comprising:
    embedding an insulating layer in a first surface of a semiconductor substrate such that a bottom surface of the insulating layer is lower than the first surface, the insulating layer having a shape of a ring, the ring having an opening inside the ring;
    forming a semiconductor integrated circuit on the first surface of the semiconductor substrate;
    forming a conductive layer on the semiconductor substrate inside the ring of the insulating layer, the conductive layer being connected to the semiconductor integrated circuit;
    forming a hole extending from a second surface of the semiconductor substrate to the bottom surface of the insulating layer and to the first surface of the semiconductor substrate inside the ring, by selectively etching the semiconductor substrate from the second surface of the semiconductor substrate, the hole having a size larger than a size of the opening in a range from the second surface to the bottom surface of the insulating layer, and having a size equal to the size of the opening in the opening;
    forming a via in the hole; and
    selectively removing a part of the conductive layer after forming the hole,
    wherein the conductive layer comprises a first layer and a second layer on the first layer, the part of the conductive layer is the first layer, and a size of the conductive layer is smaller than the size of the hole.

11. The method of claim 10,
    wherein the first layer is a conductive polysilicon layer, and the second layer is a metal silicide layer.

12. The method of claim 10,
    wherein a condition of etching the semiconductor substrate is constant from a start of the etching to a time in which the hole reaches to the conductive layer.

13. The method of claim 10,
wherein a condition of etching the semiconductor substrate is changed before a time in which the hole reaches to the conductive layer.

14. The method of claim 10, further comprising:
forming the insulating layer in parallel with forming an element isolation insulating layer which isolates elements in the semiconductor integrated circuit.

* * * * *